(12) United States Patent
Jones

(10) Patent No.: US 9,620,800 B2
(45) Date of Patent: Apr. 11, 2017

(54) CELL VOLTAGE MONITORING (CVM) PICK-UP ASSEMBLY FOR A FUEL CELL STACK

(71) Applicant: ENERGYOR TECHNOLOGIES INC, Saint-Laurent (CA)

(72) Inventor: Thomas David Jones, Montreal (CA)

(73) Assignee: ENERGYOR TECHNOLOGIES INC., Saint-Laurent, QC (CA)

( * ) Notice: Subject to any disclaimer, the term of this patent is extended or adjusted under 35 U.S.C. 154(b) by 44 days.

(21) Appl. No.: 14/620,252

(22) Filed: Feb. 12, 2015

(65) Prior Publication Data

US 2015/0155576 A1    Jun. 4, 2015

Related U.S. Application Data

(63) Continuation of application No. 13/185,924, filed on Jul. 19, 2011, now abandoned.

(60) Provisional application No. 61/400,270, filed on Jul. 26, 2010.

(51) Int. Cl.
| | | |
|---|---|---|
| *H01M 8/04* | (2016.01) |
| *H01M 8/04537* | (2016.01) |
| *H01M 8/242* | (2016.01) |
| *H01M 8/2465* | (2016.01) |
| *H01M 8/0202* | (2016.01) |
| *H01M 8/1018* | (2016.01) |
| *H01M 8/24* | (2016.01) |
| *H01M 12/00* | (2006.01) |
| *G01R 31/36* | (2006.01) |
| *H01M 8/0276* | (2016.01) |
| *H01R 13/33* | (2006.01) |

(52) U.S. Cl.
CPC ...... *H01M 8/04544* (2013.01); *H01M 8/0202* (2013.01); *H01M 8/1018* (2013.01); *H01M 8/24* (2013.01); *H01M 8/242* (2013.01); *H01M 8/2465* (2013.01); *G01R 31/3658* (2013.01); *H01M 8/0276* (2013.01); *H01M 8/04552* (2013.01); *H01M 12/00* (2013.01); *H01M 2008/1095* (2013.01); *H01R 13/33* (2013.01)

(58) Field of Classification Search
CPC .. H01M 8/04552; H01M 12/00; H01R 13/33; G01R 31/3658
See application file for complete search history.

(56) References Cited

U.S. PATENT DOCUMENTS

| | | | |
|---|---|---|---|
| 5,388,997 A | 2/1995 | Grange et al. | |
| 2003/0031914 A1* | 2/2003 | Frank et al. | 429/35 |
| 2004/0147140 A1 | 7/2004 | Fan et al. | |
| 2007/0231641 A1 | 10/2007 | Skala et al. | |
| 2008/0003844 A1 | 1/2008 | Polnyl | |

* cited by examiner

*Primary Examiner* — Milton I Cano
*Assistant Examiner* — Jimmy K Vo
(74) *Attorney, Agent, or Firm* — Philip Swain; IPSIS, Inc.

(57) ABSTRACT

A cell voltage monitoring (CVM) pick-up assembly for a fuel cell stack includes a tab and a contact wire having two ends. A loop is located between the two ends to mount the wire on the tab to resiliently urge one end towards a fuel cell to provide electrical contact with it. Also disclosed is a fuel cell stack that includes a plurality of assemblies.

13 Claims, 3 Drawing Sheets

CELL VOLTAGE MONITORING (CVM) PICK-UP ASSEMBLY FOR A FUEL CELL STACK

CROSS-REFERENCE TO RELATED APPLICATION

The present is a continuation application of U.S. patent application Ser. No. 13/185,924, filed on Jul. 19, 2011, now abandoned, which claims priority from previously filed U.S. provisional patent application No. 61/400,270, filed on Jul. 26, 2010, the contents of the which are hereby incorporated by reference.

TECHNICAL FIELD

The present generally concerns electrochemical fuel cells and more particularly to an integrated cell voltage monitoring pick-up assembly for a fuel cell stack.

BACKGROUND

A Polymer electrolyte membrane or proton exchange membrane (PEM) fuel cells having intrinsic benefits and a wide range of applications due to their relatively low operating temperatures (room temperature to approximately 80.degree. C.). The active portion of a PEM is a membrane sandwiched between an anode and a cathode layer. Fuel containing hydrogen is passed over the anode and oxygen (air) is passed over the cathode. The reactants, through the electrolyte (the membrane), react indirectly with each other generating an electrical voltage between the cathode and anode. Typical electrical potentials of PEM cells can range from 0.5 to 0.9 volts; the higher the voltage the greater the electrochemical efficiency. However, at lower cell voltages, the current density is higher but there is eventually a peak value in power density for a given set of operating conditions.

Multiple cells are combined by stacking, interconnecting individual cells in electrical series. The voltage generated by the cell stack is effectively the sum of the individual cell voltages. There are designs that use multiple cells in parallel or in a combination series parallel connection. Separator plates (bipolar plates) are inserted between the cells to separate the anode reactant of one cell from the cathode reactant of the next cell. To provide hydrogen to the anode and oxygen to the cathode without mixing, a system of fluid distribution and seals is required.

Cell voltage monitoring (CVM) systems for fuel cell stacks provide important cell voltage state-of-health information to the fuel cell system controller. Typically, the CVM system provides real time feedback and can initiate a system alarm or shutdown if a significant variation in cell voltage distribution is measured, or cell voltages are below a specific threshold value. Low cell voltages can be the result of poor operating conditions causing cell flooding or drying, or can indicate hydrogen starvation if a cell voltage becomes negative. These situations can adversely affect the performance and durability of the fuel cell stack.

Typically, cell voltage monitoring (CVM) pick-up assemblies are attached to fuel cell stacks after the stack is assembled. However, a number of drawbacks exist with this design. For example, the distance between each CVM pick-up must be very precise since tolerance stack up over the length of a fuel cell stack of many cells can result in significant CVM pick-up misalignment. Also, as the stack expands and contracts in length during normal operation, the CVM pick-up assembly must also expand and contract to maintain good cell-to-cell contact. Furthermore, the CVM pick-ups must maintain proper preload against the surface of the cell to minimize contact resistance and ensure good electrical contact. Various stack designs also have variable cell pitches so it is difficult to have a "generic" CVM system.

Thus, there is a need for an improved CVM pick-up assembly for use with fuel cell stacks.

BRIEF SUMMARY

We have designed a simple, light-weight, easy to manufacture CVM pick-up assembly for use with a fuel cell stack, which significantly reduces or essentially eliminates the difficulties and disadvantages described above. Our design includes a simple torsion spring which is urged into electrical contact with the fuel cell and which flexes as the fuel cell expands and contracts during normal operation, while maintaining electrical contact with the fuel cell.

Accordingly, there is provided a cell voltage monitoring (CVM) pick-up assembly for a fuel cell stack, the assembly comprising:
  a) a tab;
  b) a contact wire having a first end and a second end; and
  c) a loop located between the first and second ends to mount the wire on the tab to resiliently urge the first end towards a fuel cell so as to provide electrical contact therewith.

In one example, the second end of the contact wire is held away from the fuel cell.

In another example, the tab includes first and second spaced apart tab openings for receiving therein first and second non-conductive rods. The contact wire further includes a contact area located between the loop and the second end for contacting the second rod to hold the second end away from the fuel cell. The loop is mounted on the first rod such that the first end of the contact wire is urged against the fuel cell.

In one example, the tab extends away from the fuel cell.

In another example, the contact wire is a torsion spring. The torsion spring is made from gold plated music wire.

In one example, the tab is a polyethylene terephthalate (PET) gasket which extends away from the fuel cell.

According to another aspect, there is provided a fuel cell stack comprising:
  a) a plurality of stacked fuel cells;
  b) a plurality of gaskets located between each fuel cell;
  c) a plurality of cell voltage monitoring (CVM) pick-up assemblies, as described above.

In one example, two non-conductive elongate rods interconnect each pick up assembly.

In another example, the second end of each contact wire extends away from the fuel cell to permit contact with an electronic device.

DETAILED DESCRIPTION

Figure 1:
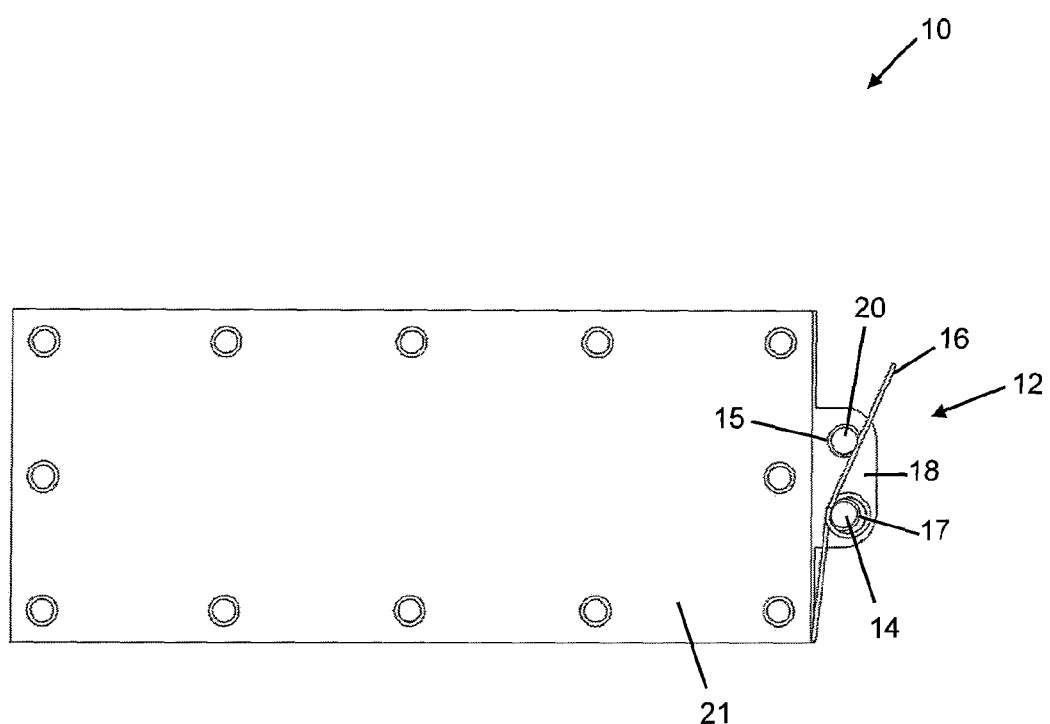
FIG. 1 is a cross-sectional top view of CVM pick-up assembly.
Figure 2:
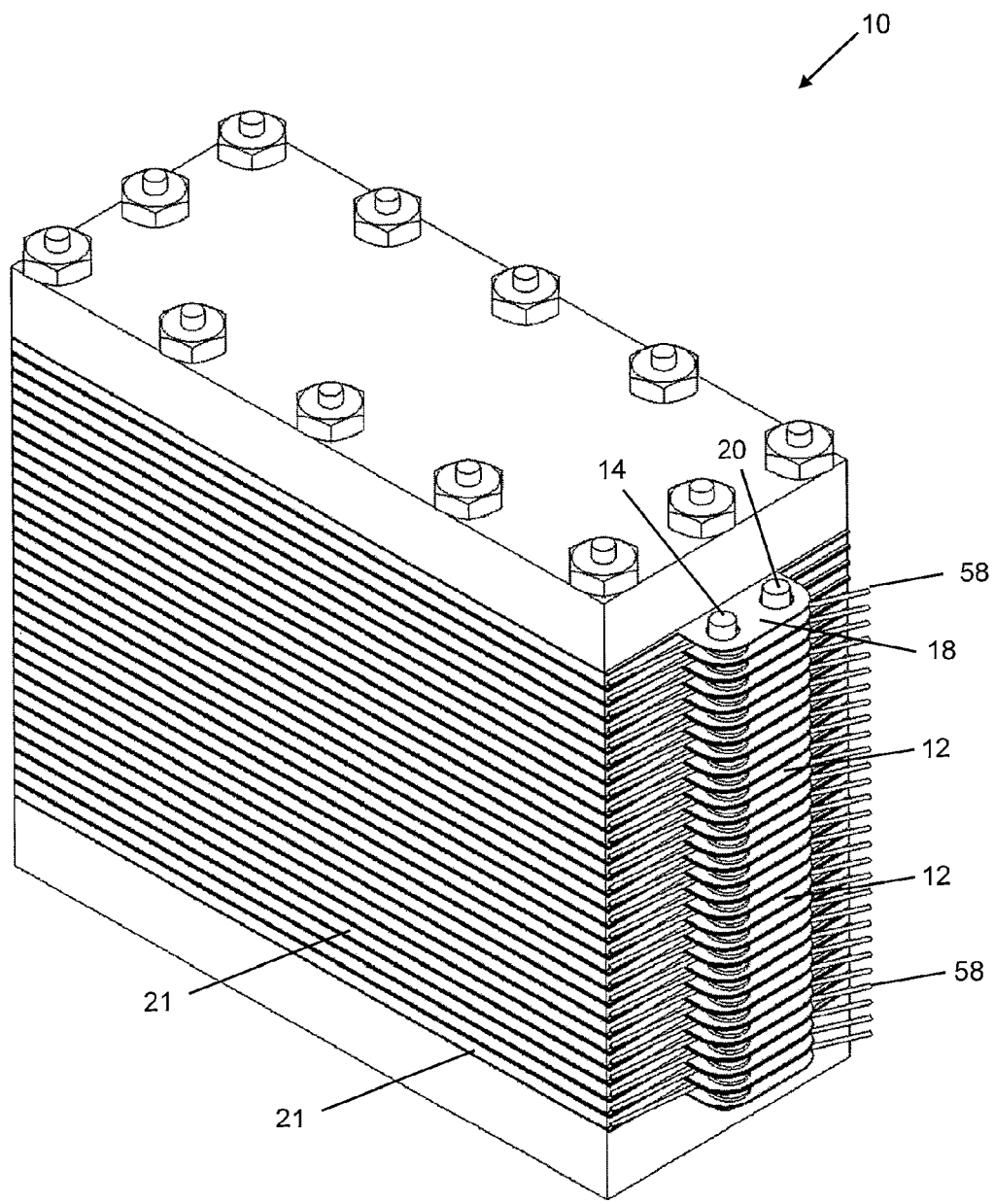
FIG. 2 is a perspective view of a fuel cell stack showing CVM pick-up assemblies.

Referring now to FIGS. 1 and 2, a cell voltage monitoring (CVM) pick-up assembly is shown generally at 12 integrated into a fuel cell stack 10. Broadly speaking, the assembly 12 includes a contact wire (CVM pick-up wire) 16, which is mounted on a tab 18 and held in place to maintain electrical contact with a fuel cell 21 in the fuel cell stack. 10. The tab 18 includes two spaced apart openings 15, 17 that are sized and shaped to receive therein two corresponding non-conductive elongate rods 14, 20 thereby holding them in place. The tab 18 extends away from the fuel cell (a unit cell) 21 and is disposed generally planar to the plane of the fuel cell 21. The tab 18 is an extension of a die cut gasket which is located between each fuel cell 21 in the fuel cell stack 10. The tab 18 is made from polyethylene terephthalate (PET) and is an integrated CVM system mounting feature. Other mechanically stiff tab materials may also be used such as Polyether ether ketone (PEEK).

Figure 3:
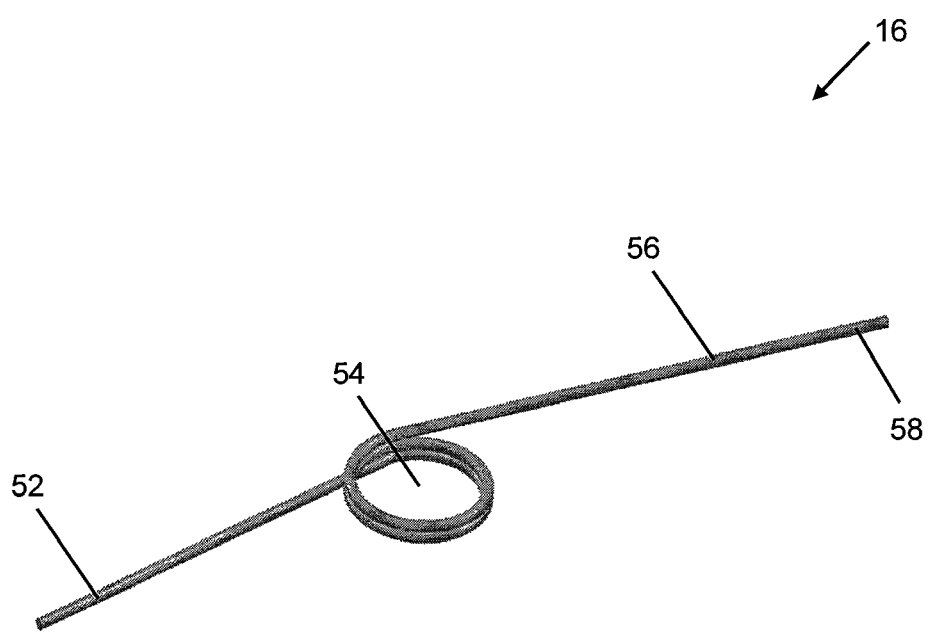
FIG. 3 is a perspective view of the CVM torsion spring pick-up.

Referring now to FIGS. 1 and 3, the contact wire 16 includes a first end 52 and a second end 58. A loop 54 is located between the first and second ends 52, 58. The loop 54 is created by looping a straight wire back on itself so as to create a torsion spring. Although one loop is illustrated, a person skilled in the art will understand that one or more loops can be used in the assembly. The contact wire 16 includes a contact area 56 that is located between the loop 54 and the second end 58 for contacting the second rod 20.

Still referring to FIGS. 1 and 3, the loop 54 which is mounted onto the first rod 14 resiliently urges an area near the first end 52 of the contact wire 16 towards the fuel cell 21 so as to provide electrical contact therewith. The second rod 20 holds the second end 58 of the contact wire 16 away from the fuel cell 21 while forcing the area of the first end 52 of the contact wire 16 to contact the fuel cell 21 and to be held thereagainst. In one example, the contact wire 16 is a torsion spring. In another example, the torsion spring is gold plated music wire so as to maintain proper electrical contact with the fuel cell. Another suitable material would be stainless steel. The gold plated music wire torsion springs are selected because of their sufficient resilience when held in place using the rods and their resistance to corrosion. A wire (not shown), which is attached directly to the CVM electronics, is soldered directly to the second end of the contact wire 16 and covered with an electrically isolative material such as heat shrink to ensure cell-to-cell shorting does not occur.

Referring now to FIG. 2, the fuel cell stack 10 includes a plurality of stacked fuel cells 21. Between each of the stacked fuel cells 21 is a gasket, each of which terminates in the CVM assembly 12 described above. Typically, the two non-conductive rods 14, 20 extend longitudinally through the respective openings 15, 17 of each tab 18 substantially the entire height of the stacked fuel cells 21. Each second end 58 of the contact wires 16 are angled away from the fuel cell stack 21 with sufficient clearance to permit connection to the CVM electronic devices.

During assembly of the fuel cell stack, the torsion spring 16 is located against each fuel cell 21 and held in place with the rod 14. The torsion spring 16 is then preloaded against the fuel cell 21 by bending it back away from the fuel cell 21 and placing the rod 20 into the second opening 17. The rods 14 and 20 are held in place by two openings in the tab 18 which protrudes from the fuel cell 21.

Advantageously, the CVM pick-ups are integrated into the unit cell design. The torsion springs 16 are able to move longitudinally along the stack 10 and still maintain good electrical contact with the cell 21. This assembly 12 can also be easily used with stacks 10 of varying cell pitch. Furthermore, the integrated CVM mounting of each unit fuel cell permits the CVM pick-up to "float" with the fuel cell as the stack 10 expands and contracts during normal operation. Moreover, the assembly is sufficiently generic to allow its use with fuel cells of varying pitches and is very lightweight.

Other Embodiments

From the foregoing description, it will be apparent to one of ordinary skill in the art that variations and modifications may be made to the embodiments described herein to adapt it to various usages and conditions.

I claim:

1. A fuel cells stack and a cell voltage monitoring (CVM) pick-up assembly, the assembly comprising:
   A gasket located against a fuel cell plate in the fuel cell stack, the gasket having a tab extending away therefrom and having first and second openings receiving therein first and second non-conductive rods; and
   A contact wire having first and second ends, a loop located between the ends and a contact area located between the loop and the second end, the loop being mounted on the first rod so that the first end is placed against the fuel cell plate so as to maintain electrical contact therewith; and the second end is placed against the second rod so that the second end is pointed away from the fuel cell plate and a part of the contact portion is a contact area between the second end and the second rod,
   wherein the contact wire is a resilient member.

2. The assembly, according to claim 1, in which the contact area, when in contact with the second rod, locates the second end of the contact wire away from the fuel cell plate.

3. The assembly, according to claim 1, in which the first and second openings in the tab are spaced apart.

4. The assembly, according to claim 1, in which the tab and the fuel cell plate are in the same plane.

5. The assembly, according to claim 1, in which the tab extends away from the fuel cell plate.

6. The assembly, according to claim 1, in which the resilient member is a torsion spring.

7. The assembly, according to claim 6, in which the torsion spring is made from gold plated music wire.

8. The assembly, according to claim 1, in which the gasket and the tab are made from polyethylene terephthalate (PET).

9. A fuel cell stack comprising:
   A plurality of stacked fuel cell plates;
   A plurality of gaskets located between each fuel cell plate, each gasket being located against a fuel cell plate in the fuel cell stack, the gaskets each having:
   i) a tab extending away therefrom and having first and second openings receiving therein first and second non-conductive rods; and
   ii) A contact wire having first and second ends, a loop located between the ends and a contact area located between the loop and the second end, the loop being mounted on the first rod so that the first end is placed against the fuel cell plate so as to maintain electrical contact therewith; and the second end is placed against the second rod so that the second end is pointed away from the fuel cell plate and a part of the contact portion is a contact area between the second end and the second rod,
   wherein the contact wire is a resilient member.

10. The fuel cell stack, according to claim 9 in which two elongate non-conductive rods interconnect each tab.

11. The fuel cell stack, according to claim 9, in which the second end of each contact wire extends away from the fuel cell to permit contact with an electronic device.

12. The fuel cell stack, according to claim 9, in which the resilient member is made from gold plated music wire.

13. The fuel cell stack, according to claim 9, in which the gasket and the tab are made from polyethylene terephthalate (PET).

* * * * *